(12) United States Patent
Jo et al.

(10) Patent No.: US 7,590,003 B2
(45) Date of Patent: Sep. 15, 2009

(54) SELF-REFERENCE SENSE AMPLIFIER CIRCUIT AND SENSING METHOD

(75) Inventors: Sung-Kyu Jo, Yongin-si (KR); Yun-Ho Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 170 days.

(21) Appl. No.: 11/790,149

(22) Filed: Apr. 24, 2007

(65) Prior Publication Data

US 2008/0106945 A1 May 8, 2008

(30) Foreign Application Priority Data

Nov. 3, 2006 (KR) .................... 10-2006-0108305

(51) Int. Cl.
*G11C 16/04* (2006.01)

(52) U.S. Cl. ................ 365/185.17; 365/185.21; 365/185.22; 365/185.25

(58) Field of Classification Search ............ 365/185.21, 365/185.24, 185.25, 185.33, 185.17, 185.22
See application file for complete search history.

(56) References Cited

U.S. PATENT DOCUMENTS

| 5,297,092 | A | * | 3/1994 | Johnson | 365/203 |
| 5,301,160 | A | * | 4/1994 | McAdams | 365/226 |
| 5,524,094 | A | | 6/1996 | Nobukata et al. | |
| 6,791,880 | B1 | | 9/2004 | Kurihara et al. | |
| 6,822,907 | B2 | | 11/2004 | Maruyama et al. | |
| 7,263,012 | B2 | * | 8/2007 | Sato | 365/203 |
| 2006/0083070 | A1 | | 4/2006 | Arakawa | |

\* cited by examiner

*Primary Examiner*—Pho M. Luu
(74) *Attorney, Agent, or Firm*—Volentine & Whitt, PLLC (57) ABSTRACT

A sense amplifier circuit for a flash memory device is disclosed. The sense amplifier including a first transistor controlled by a first voltage applied via a selected bit line, and a second transistor controlled by a second voltage applied via an unselected bit line. The second transistor has a current driving capability lower than a current driving capability of the first transistor.

20 Claims, 7 Drawing Sheets

SELF-REFERENCE SENSE AMPLIFIER CIRCUIT AND SENSING METHOD

BACKGROUND AND SUMMARY

1. Field of the Invention

The present invention relates to semiconductor memory devices. More particularly, the invention relates to a sense amplifier circuit having a self-reference and capable of being incorporated with a flash memory device, as well as a related sensing method.

This application claims priority under 35 U.S.C. §119 to Korean Patent Application 10-2006-0108305, filed on Nov. 3, 2006, the subject matter of which is hereby incorporated by reference in its entirety.

2. Discussion of Related Art

Semiconductor memory devices, such as Dynamic Random Access Memory (DRAM), Static Random Access Memory (SRAM), flash memory, etc., all operate according to certain basic operations, nominally referred to as read and write operations. The approaches to writing data in these different memories vary widely. The approaches to reading data from the different memories also vary in many respects. However, most read operations make use of a specialized output circuits which may be generically said to perform functions associated with a sense amplifier circuit.

In particular, flash memory devices use a sense amplifier circuit operate in read, program, verify, and erase verify operations. A constituent sense amplifier circuit (or sense amplifier like circuit) is implicated in many, if not all, of these operations. Conventional flash memory devices often incorporate a sense amplifier functionality in sense circuits implemented using a current mirror, (e.g., a differential sense amplifier), or a single ended sense amplifier. Despite their widespread use, however, conventional sense amplifier circuits suffer from several notable problems.

Figure 1:
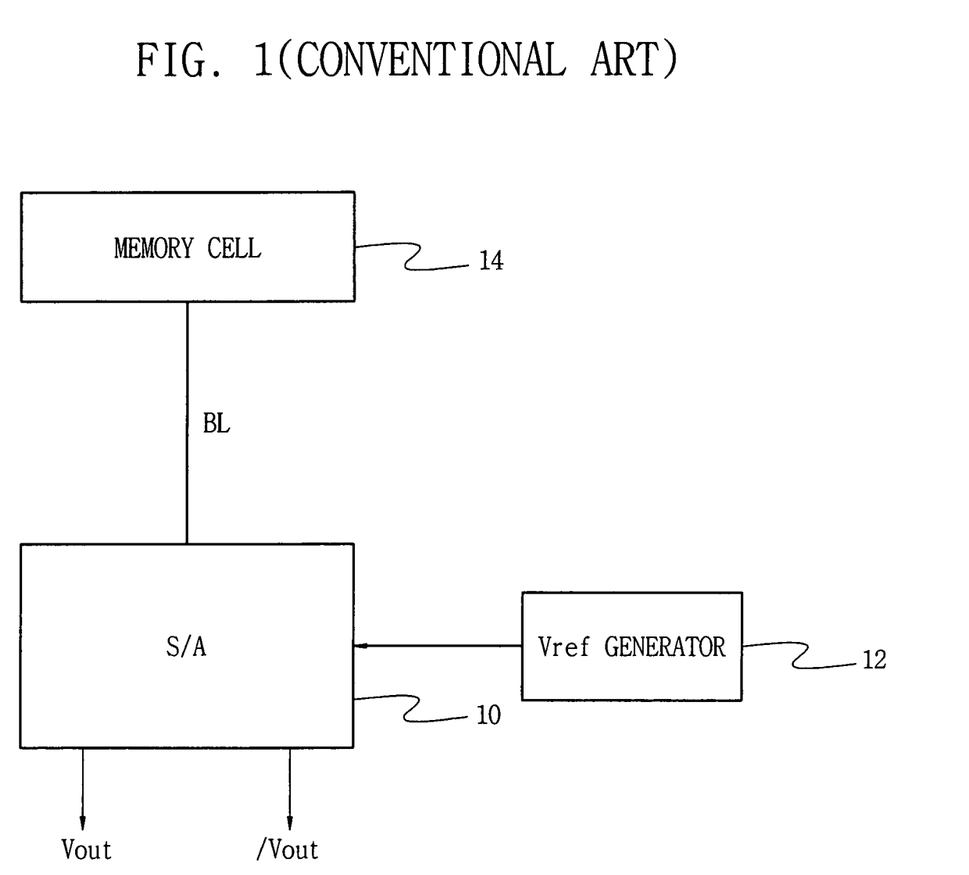
FIG. 1 is a block diagram generally illustrating a conventional sense amplifier.

Figure (FIG.) 1 is a block diagram generally illustrating a conventional sense amplifier. Referring to FIG. 1, a sense amplifier circuit S/A 10 is connected between a reference voltage generator 12 and a memory cell 14.

Sense amplifier circuit 10 is a current mirror type circuit in which a bit line voltage BL is compared with a reference voltage Vref during read and verify operations. During this voltage comparison, current flows to a transistor in the current mirror circuit having a relatively high voltage. In accordance with the comparison, sense amplifier circuit 10 provides a differential output signal (Vout, /Vout). This type of current mirror sense amplifier circuit is conventionally well understood.

As commonly implemented, reference voltage generator 12 is separately provided on a different part of the constituent substrate from the memory cell array containing memory cell 14.

Memory cell 14 is a flash memory cell in the assumed example. In order to obtain sense and amplification operation through sense amplifier circuit 10, a word line coupled to the gate of memory cell 14 must first be selected, and a bit line associated with the drain or source of memory cell 14 must also be selected.

Figure 2:
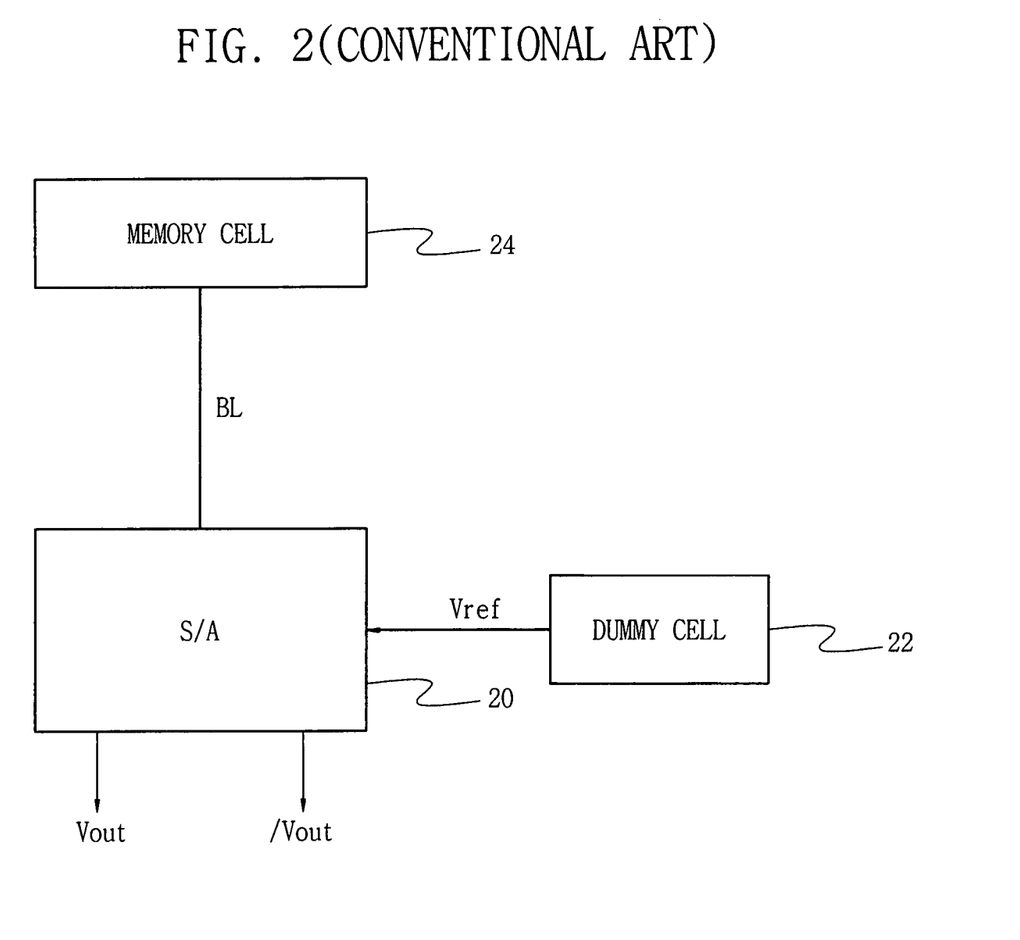
FIG. 2 is a block diagram illustrating another example of a conventional sense amplifier.

FIG. 2 is a block diagram illustrating another conventional example of a sense amplifier. This conventional embodiment includes a sense amplifier circuit 20, a dummy cell 22, and a memory cell 24. In comparison with FIG. 1, dummy cell 22 of FIG. 2 is added to generate a reference voltage Vref required by sense amplifier circuit 20.

Dummy cell 22 is commonly disposed in a region of the substrate on which sense amplifier circuit 20 is constructed which is different from the region in which memory cell 24 is disposed.

Whether a reference voltage generator or a dummy cell is implemented, the overall size of the conventional flash memory device is unfortunately large. The separate provision (i.e., location at different portions of the underlying substrate) of the reference voltage source is one cause for this size issue.

Further, errors in the operation of the flash memory device may result from ineffective electrical connections between bit lines and the peripherally located circuits generating the reference voltage.

Furthermore, various process related variables may result in differences in the endurances and/or threshold voltages Vt between the main memory cells and associated dummy cells. Such differences may result in reference voltage producing dummy cells that have low current driving capabilities relative to the main memory cells.

SUMMARY OF THE INVENTION

Embodiment of the invention provides a sense amplifier having a stabilized sensing operation. Embodiments of the invention also provide a substantially reduced possibility of producing mismatches between the current driving capabilities or endurance characteristics of transistors located in a main memory array area of the substrate verses a peripheral area of the substrate.

In one embodiment, the invention provides a sense amplifier circuit, comprising; a first transistor controlled by a first voltage applied via a selected bit line, and a second transistor controlled by a second voltage applied via an unselected bit line, the second transistor having a current driving capability lower than a current driving capability of the first transistor, wherein the selected bit line selects a nonvolatile memory cell from a plurality of nonvolatile memory cells within a flash memory.

In another embodiment, the invention provides a flash memory device, comprising; a current mirror type sense amplifier circuit, first and second sub arrays, each having a plurality of memory cells selected in relation to a plurality of bit lines and a plurality of word lines, a first switching circuit controlled by a first control signal to selectively couple any one of the plurality of bit lines in the first sub array to the sense amplifier circuit, and a second switching circuit controlled by a second control signal to selectively couple any one of the plurality of bit lines in the second sub array to the sense amplifier circuit, wherein a selected bit line in the first sub array is connected to the sense amplifier via a first transistor and an unselected bit line in the second sub array is coupled to the sense amplifier circuit via a second transistor.

In another embodiment, the invention provides a method of sensing data in a selected nonvolatile memory cell using a current mirror type sense amplifier circuit within a flash memory device, the method comprising; supplying a reference voltage to the sense amplifier circuit via an unselected bit line, and using different current driving capabilities for first and second transistors within the sense amplifier to sense the data in relation to the reference voltage.

DESCRIPTION OF EMBODIMENTS

Embodiments of the present invention now will be described in some additional detail with reference to FIGS. 3 through 7. This invention may, however, be embodied in many different forms and should not be construed as limited to only the illustrated embodiments. Rather these embodiments are presented as teaching examples.

Figure 3:
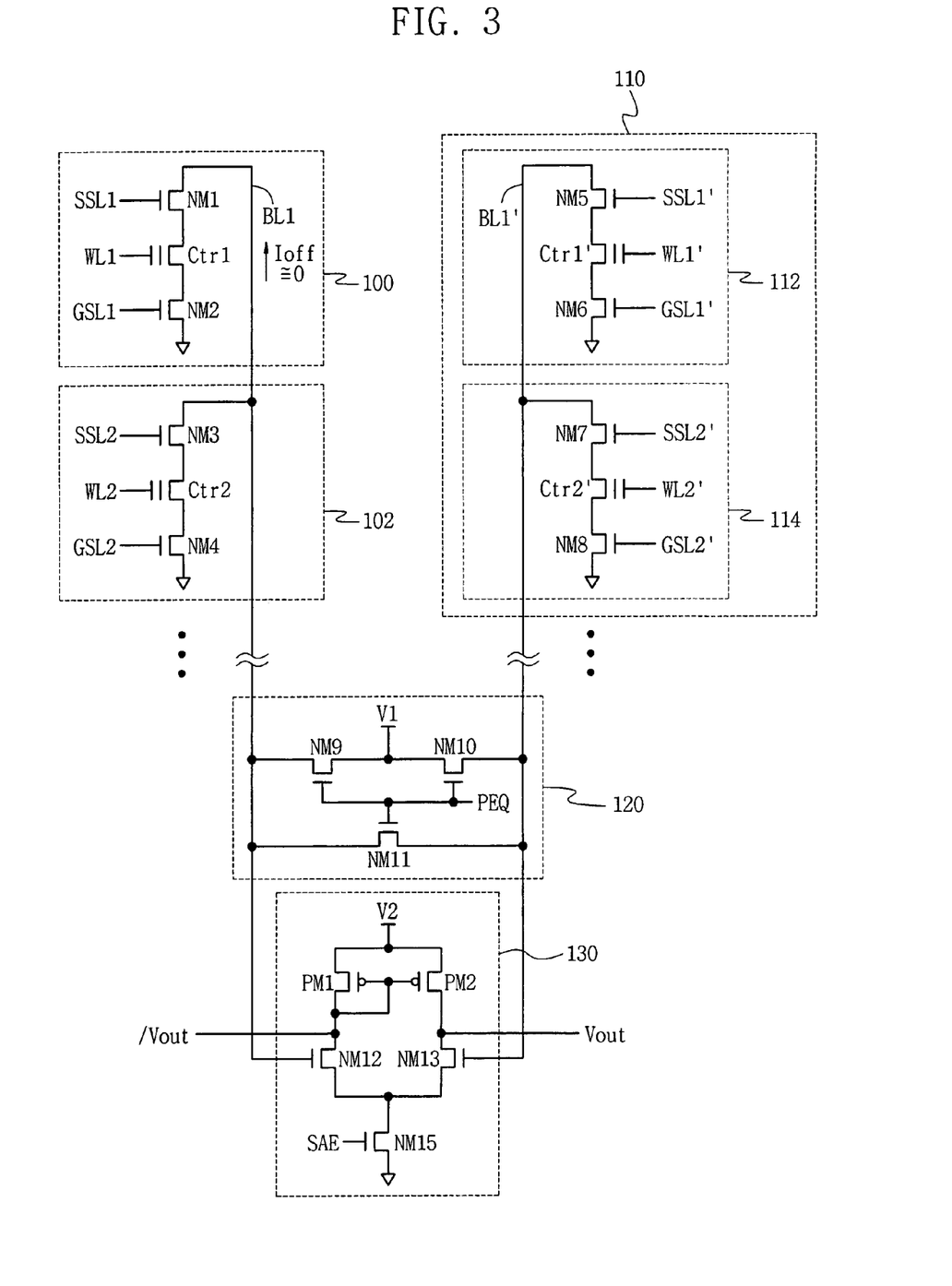
FIGS. 3 and 4 are circuit diagrams illustrating a sense amplifier circuit adapted for use in a flash memory according to an embodiment of the invention.
Figure 4:
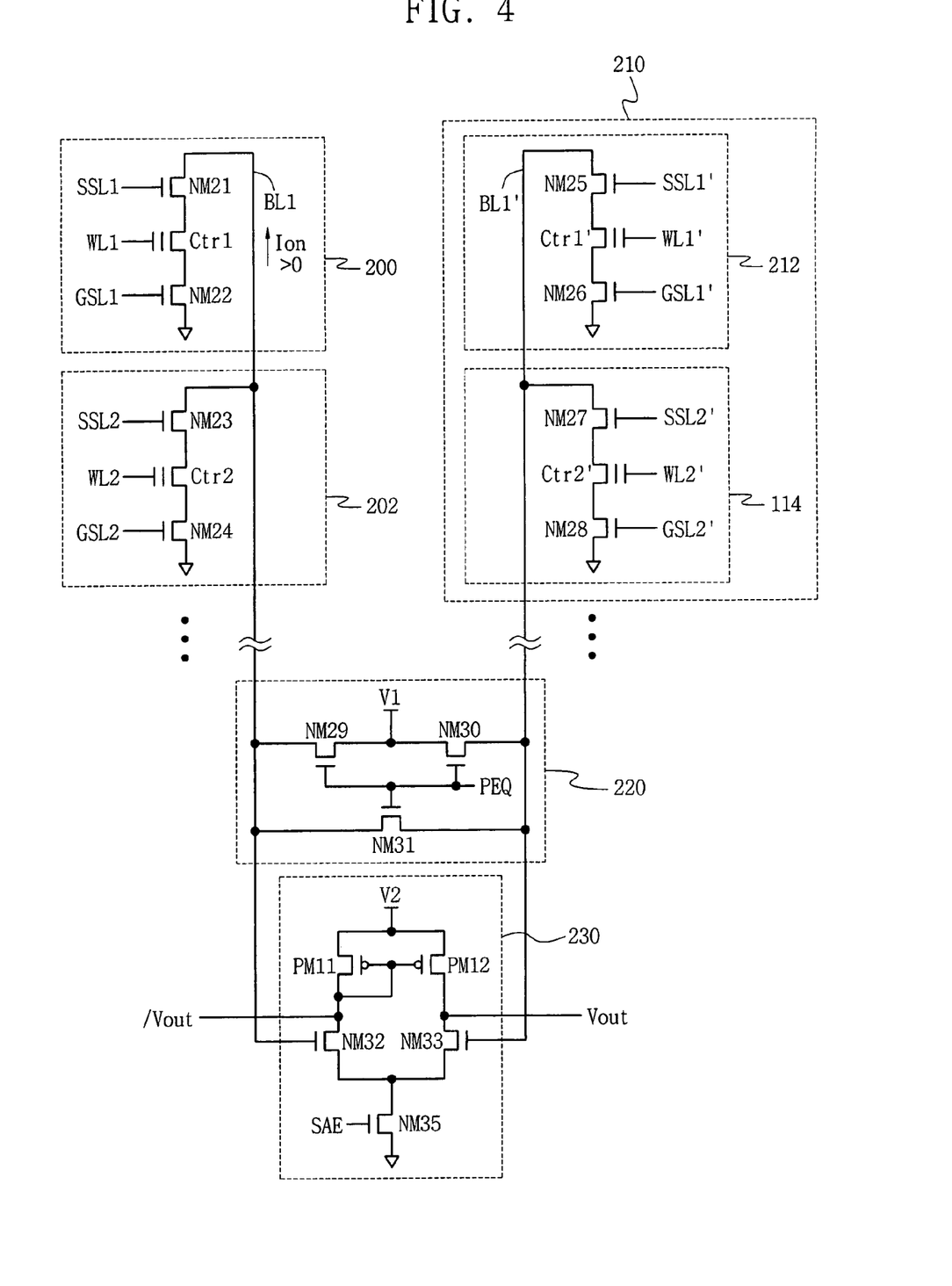

FIGS. 3 and 4 are circuit diagrams illustrating a sense amplifier circuit susceptible to incorporation within a semiconductor memory device, such as a flash memory device. Indeed, the illustrated examples assume a flash memory configuration of bit lines and memory cells. The embodiment of FIG. 3 assumes an "OFF" state for a selected memory cell as compared with the embodiment of FIG. 4 which assumes an "ON" state.

Referring to FIG. 3, a sense amplifier circuit 130 includes a first NMOS transistor NM12, a second NMOS transistor NM13, a first PMOS transistor PM1 and a second PMOS transistor PM2.

The gate of first NMOS transistor NM12 is connected to a selected bit line BL1, and the gate of the second NMOS transistor NM13 is connected to an unselected bit line BL1'. First NMOS transistor NM12 is controlled by a voltage applied from the selected bit line BL1, and second NMOS transistor NM13 is controlled by a voltage applied from an unselected bit line BL1'. In the illustrated embodiment, the current driving capability of first NMOS transistor NM12 is higher than the current driving capability of second NMOS transistor NM13.

Sense amplifier circuit 130 also includes a control transistor NM15 disposed between ground and the commonly connected sources of first NMOS transistor NM12 and second transistor NM13. The gate of control transistor NM15 is connected to a sense amplifier enable signal SAE that controls the sensing point.

A power source voltage V2 is applied to the commonly connected sources of first PMOS transistor PM1 and second PMOS transistor PM2. The gates of first PMOS transistor PM1 and second PMOS transistor PM2 are connected to the drain of first PMOS transistor PM1.

The drain of second PMOS transistor PM2 is connected to the drain of second NMOS transistor NM13, and drain of first PMOS transistor PM1 is connected to the drain of first NMOS transistor NM12.

Drains of first and second NMOS transistors NM12 and NM13 form output differential output nodes /Vout and Vout.

An equalizer 120 equalizes bit lines BL1 and BL1' when a precharge voltage is provided between sense amplifier circuit 130 and bit lines BL1, BL1' during a precharge operation.

In the illustrated embodiment, equalizer 120 includes three NMOS transistors NM9, NM10 and NM11 controlled by a precharge enable signal PEQ. Equalizer 120 equalizes bit lines BL1 and BL1' with a precharge voltage V1 during precharge. The precharge voltage V1 may be power source voltage VCC.

Sensing operations for sense amplifier circuit 130 will now be described for cases where the memory cell connected to a selected word line and a selected bit line is assumed to be in an OFF state and an ON state, according to the embodiment illustrated in FIGS. 3 and 4, respectively.

Referring first to FIG. 3, it is assumed that word line WL1, bit line BL1 and memory cell 100 are selected. Under these assumptions, the word lines WL2, WL1' and WL2' and bit line BL1' are unselected. (Of note, these examples show only a limited number of memory cells, word lines and bits lines for purposes of clarity).

Before undertaking a sensing operation with sense amplifier circuit 130, bit lines BL1 and BL1' are precharged with a precharge voltage. At this time, the voltages applied to the gates of first transistor NM12 and second transistor NM13 are the same.

When memory cell 100 is selected through word line WL1 and bit line BL1 and the sensing operation begins through sense amplifier circuit 130, a cell transistor Ctr1 has an OFF state, and as such current discharged to ground through bit line BL1, and the OFF bit line current Ioff goes to 0. Thus, first NMOS transistor NM12 and second NMOS transistor NM13 of sense amplifier circuit 130 are all controlled by the precharge voltage applied to their respective gates.

Since the current driving capability of first NMOS transistor NM12 is greater than the current driving capability of the second NMOS transistor NM13, the current bypassed to ground through first NMOS transistor NM12 is greater than current bypassed to ground through second NMOS transistor NM13. That is, the drain voltage /Vout associated with first NMOS transistor NM12 becomes smaller than the drain voltage Vout associated with second NMOS transistor NM13, and the OFF cell is sensed.

Referring to FIG. 4, it is assumed that word line WL1 and bit line BL1 are selected, that cell transistor Ctr1 has an ON state, and that the voltage of bit line BL1 (initially charged to the precharge voltage) becomes lower during the sensing operation.

The drain current of a transistor is generally proportionate to its channel size and the square of the applied gate voltage. Thus, when a gate voltage of first NMOS transistor NM32 is lower than the gate voltage of second NMOS transistor NM33, current bypassed through second NMOS transistor NM33 is greater than current bypassed through first NMOS transistor NM32.

As the voltage on selected bit line BL1 drops under the influence of ON bit line current (Ion), and as sense enable signal SAE is enabled to turn ON control transistor NM35, the drain voltage /Vout associated with first NMOS transistor NM32 goes higher than the drain voltage Vout associated with second NMOS transistor NM33, and the ON cell state is sensed.

In the foregoing embodiments, the sense amplifier circuit, the current driving capabilities of a first transistor controlled by a selected bit line and a second transistor controlled by an unselected bit line are different. Therefore, instead of separately requiring a dummy cell or a reference voltage generator to generate a reference voltage, as in the conventional sense amplifier configuration, a precharge voltage on the unselected bit line may be used as a reference voltage. Thus, the term 'self-reference' is used to identify this type of sense amplifier circuit.

Figure 5:
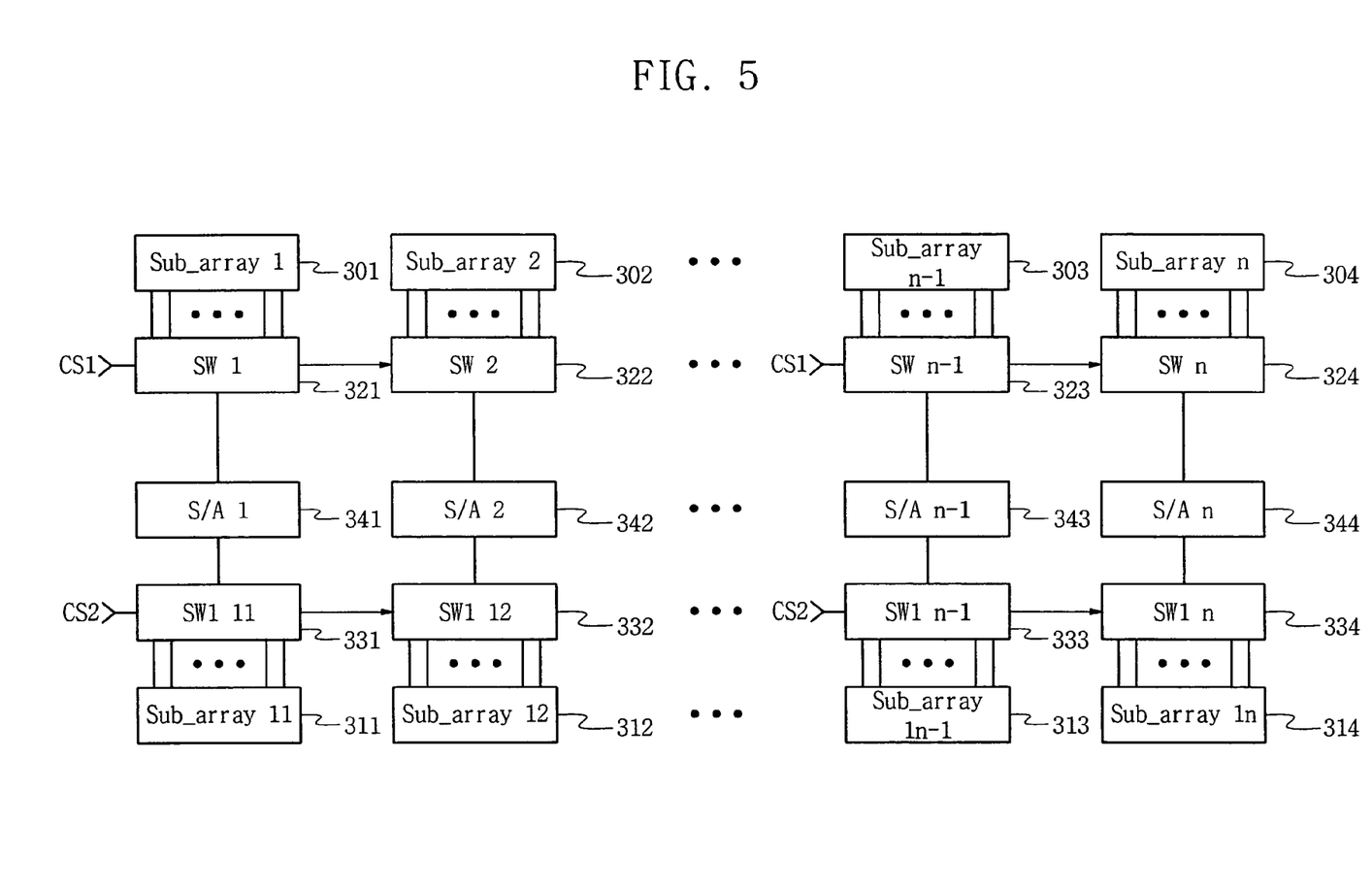
FIG. 5 is a block diagram illustrating one possible configuration for a flash memory device including a sense amplifier circuit according to an embodiment of the invention.

FIG. 5 is a block diagram illustrating one possible configuration for a flash memory device incorporating a plurality of sense amplifier circuits according to an embodiment of the invention.

With reference to FIG. 5, a flash memory device includes a plurality of sub arrays 301~304, 311~314, a plurality of switching circuits 321~324, 331~334, and a corresponding plurality of sense amplifier circuits 341~344.

As an example, a first sub array Sub_array1, 301, a second sub array Sub_array11, 311, a first switching circuit SW1, 321, a second switching circuit SW11, 331, and a sense amplifier circuit S/A1, 341 are described.

The first sub array 301 and the second sub array 311 includes a plurality of memory cells selected by bit lines and word lines. The first switching circuit 321 is controlled by a first control signal CS1, and so selectively connects any one of bit lines in the first sub array 301 to the sense amplifier circuit 341. The second switching circuit 331 is controlled by a second control signal CS2, and so selectively connects any one of bit lines in the second sub array 311 to the sense amplifier circuit.

When the first sub array 301 has a selected word line and selected bit line, any one of bit lines in the second sub array 311 is connected to the sense amplifier circuit.

As shown in FIG. 3 or 4, the sense amplifier circuit includes a first NMOS transistor NM12, NM32 whose gate is connected to a selected bit line, and a second NMOS transistor NM13, NM33 whose gate is connected to any one of bit lines in the second sub array 311.

The current driving capability of the first NMOS transistor NM12, NM32 should be greater than the current driving capability of the second NMOS transistor NM13, NM33 as described above.

A method of sensing data from a memory cell selected by a sense amplifier circuit according to an embodiment of the invention will be described with reference to FIGS. 3 through 5.

According to an embodiment of the invention, the method of sensing data in a flash memory device includes supplying a reference voltage using an unselected bit line BL1', wherein the current driving capabilities of a first NMOS transistor NM12, NM32 and a second NMOS transistor NM13, NM33 as input terminals in the sense amplifier circuit 130, 230, 341~344 are different from each other, and the current driving capability of the first NMOS transistor NM12, NM32 controlled by a selected bit line BL1 coupled to the selected memory cell 100, 200 is greater than the current driving capability of the second NMOS transistor NM13, NM33 controlled by the unselected bit line BL1'.

When the selected memory cell 100 is in an OFF state as shown in FIG. 3, a voltage(Vout) level of the drain of second NMOS transistor NM13 becomes higher than a voltage level of the drain of first NMOS transistor NM12 in a sensing operation of the selected memory cell.

When the selected memory cell 200 is in an ON state as shown in FIG. 4, a voltage(/Vout) level of the drain of the first NMOS transistor NM32 becomes higher than a voltage(Vout) level of the drain of the second NMOS transistor NM33 in the sensing operation of the selected memory cell 200.

As described above, in a method of sensing data in a flash memory device according to an embodiment of the invention, current driving capabilities of two transistors as input terminals are different from each other, and a precharge voltage of an unselected bit line is used as a reference voltage, thus a dummy cell or additional circuits required for a reference voltage in a conventional art are unnecessary.

Figure 6:
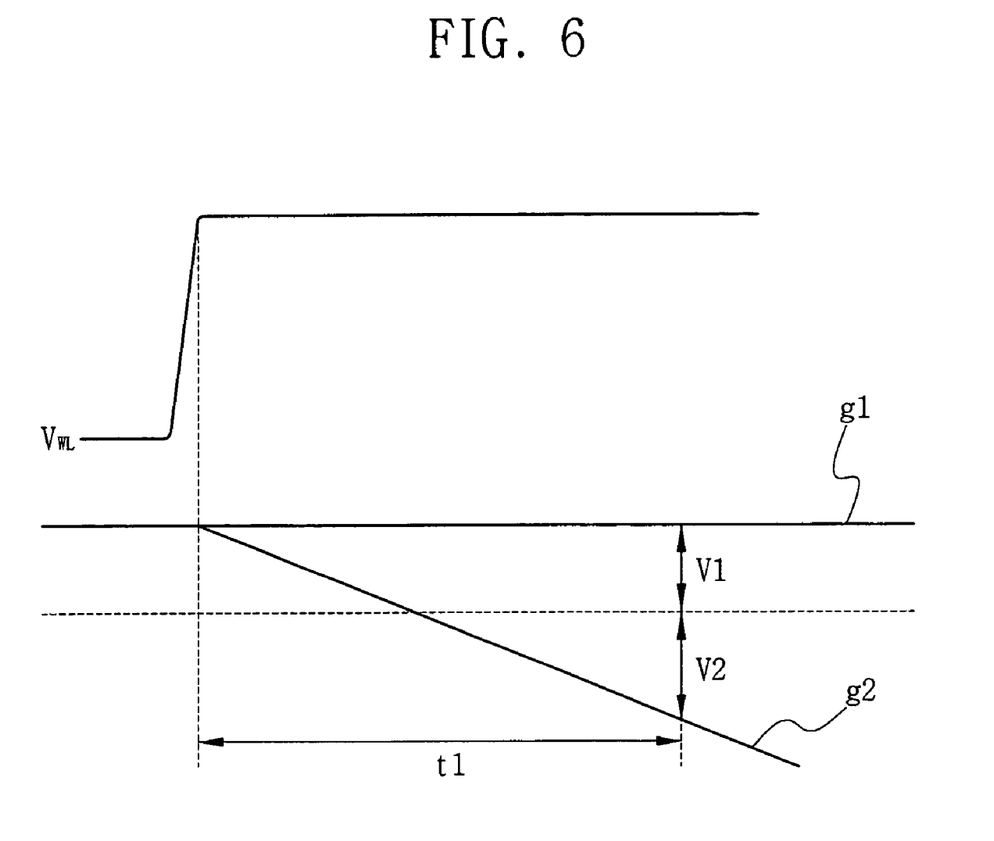
FIGS. 6 and 7 are related timing diagrams illustrating the performance effects of a sense amplifier circuit according to an embodiment of the invention with a conventional sense amplifier circuit.
Figure 7:
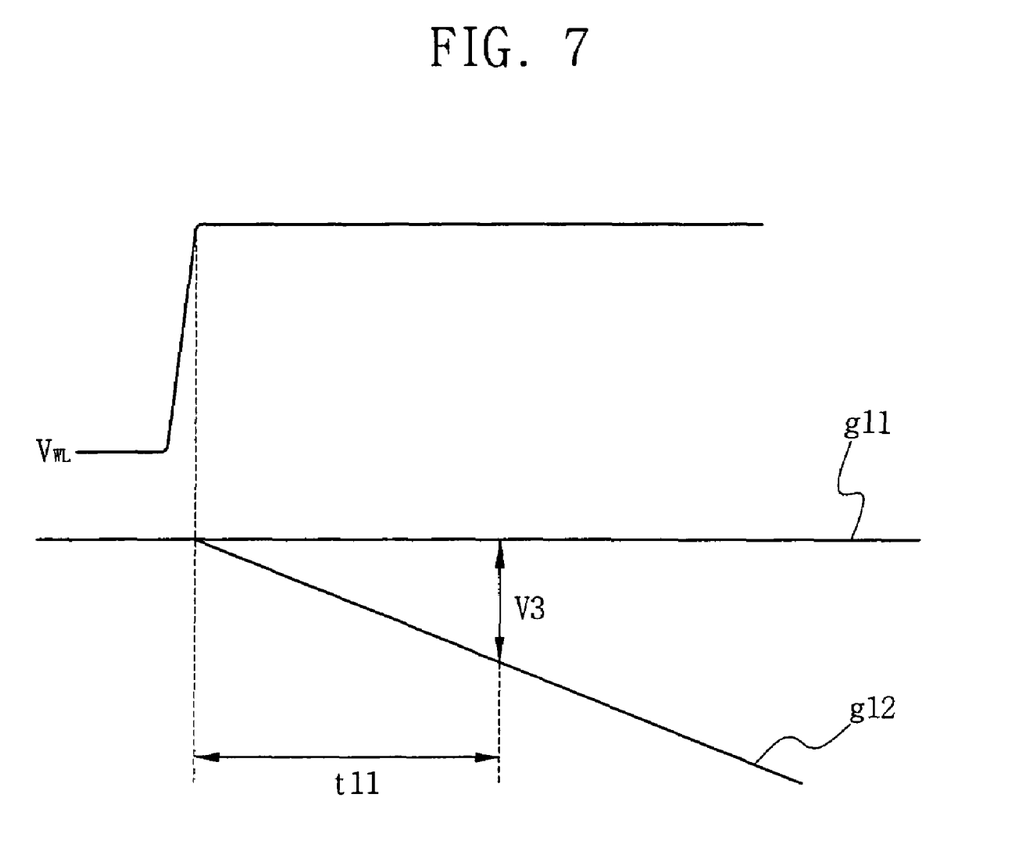

FIGS. 6 and 7 are timing diagrams comparing the effect of a conventional sense amplifier circuit with a sense amplifier circuit according to an embodiment of the invention. FIG. 6 is a timing diagram related to the operation of the conventional sense amplifier circuit, and FIG. 7 is a timing diagram related to operation of a sense amplifier circuit according to an embodiment of the invention.

With reference to FIGS. 6 and 7, g1 and g11 indicate a sensing operation directed to a memory cell having an OFF state, and g2 and g12 indicate a sensing operation directed to a memory cell with an ON state. In the conventional sense amplifier, a voltage margin of V1 is required for sensing the OFF memory cell and a voltage margin of V2 is required for sensing the ON memory cell, both being determined in relation to reference voltage Vref.

In a sense amplifier according to an embodiment of the invention, a self-reference precharge voltage from an unselected bit line is used as a reference voltage, thus allowing the use of a single voltage margin V3 for sensing both the Off and ON memory cells.

Additionally, sensing time t11 is shorter than conventional sensing time t1. This ability allows improvements in operating speed.

It will be apparent to those skilled in the art that various modifications and alterations may be made in the foregoing embodiments without departing from the scope of the invention as defined by the attached claims. For example, the NMOS and PMOS designations within the foregoing embodiments, as welled as the logic level of associated circuitry may be reversed.

What is claimed is:

1. A sense amplifier circuit providing a differential signal output, comprising:
    a first transistor controlled by a first voltage applied via a selected bit line; and
    a second transistor controlled by a second voltage applied via an unselected bit line, the second transistor having a current driving capability lower than a current driving capability of the first transistor;
    wherein the selected bit line selects a nonvolatile memory cell from a plurality of nonvolatile memory cells within a flash memory, and
    the first and second transistors form respective output nodes for the differential signal.

2. The circuit of claim 1, wherein the second voltage applied via the unselected bit line is a precharge voltage.

3. The circuit of claim 1, wherein the sense amplifier circuit further comprises:
    a control transistor disposed between ground and commonly connected sources of the first and second transistors, and being controlled by a sense amplifier enable signal.

4. The circuit of claim 1, wherein the first and second transistors are NMOS transistors.

5. The circuit of claim 4, wherein the sense amplifier circuit further comprises:
    a first PMOS transistor having a source connected to an applied power source voltage, a drain coupled to the drain of the first transistor, and a gate coupled to the drain; and
    a second PMOS transistor having a source connected to the applied power source voltage, a drain coupled to the drain of the second transistor, and a gate coupled to the drain;
    wherein the drains of the first and second transistors form the respective output nodes for the differential signal output.

6. The circuit of claim 5, wherein if a gate voltage applied to the first transistor is lower than a gate voltage applied to the second transistor, current bypassed to ground through the second transistor is greater than current bypassed to ground through the first transistor.

7. The circuit of claim 1, wherein if the selected memory cell is in an OFF state, a voltage level of the drain of the second transistor becomes higher than a voltage level of the drain of the first transistor during a sensing operation associated with the selected memory cell.

8. The circuit of claim 1, wherein if the selected memory cell is in an ON state, a voltage level of the drain of the first transistor becomes higher than a voltage level of the drain of the second transistor during a sensing operation associated with the selected memory cell.

9. A flash memory device, comprising:
a current mirror type sense amplifier circuit;
first and second sub arrays, each having a plurality of memory cells selected in relation to a plurality of bit lines and a plurality of word lines;
a first switching circuit controlled by a first control signal to selectively couple any one of the plurality of bit lines in the first sub array to the sense amplifier circuit; and
a second switching circuit controlled by a second control signal to selectively couple any one of the plurality of bit lines in the second sub array to the sense amplifier circuit,
wherein a selected bit line in the first sub array is connected to the sense amplifier via a first transistor and an unselected bit line in the second sub array is coupled to the sense amplifier circuit via a second transistor, and
the first and second transistors form respective output nodes for a differential signal output by the sense amplifier.

10. The flash memory device of claim 9, wherein the first transistor is controlled by a first voltage applied via the selected bit line; and
the second transistor is controlled by a second voltage applied via the unselected bit line, wherein the second transistor has a current driving capability lower than a current driving capability of the first transistor.

11. The flash memory device of claim 10, wherein the second voltage applied via the unselected bit line is a precharge voltage.

12. The flash memory device of claim 10, wherein the sense amplifier circuit further comprises:
a control transistor disposed between ground and commonly connected sources of the first and second transistors, and being controlled by a sense amplifier enable signal.

13. The flash memory device of claim 10, wherein the first and second transistors are NMOS transistors.

14. The flash memory device of claim 13, wherein the sense amplifier circuit further comprises:

a first PMOS transistor having a source connected to an applied power source voltage, a drain coupled to the drain of the first transistor, and a gate coupled to the drain; and
a second PMOS transistor having a source connected to the applied power source voltage, a drain coupled to the drain of the second transistor, and a gate coupled to the drain;
wherein the drains of the first and second transistors form the respective output nodes for the differential signal output by the sense amplifier.

15. The flash memory device of claim 14, wherein if a gate voltage applied to the first transistor is lower than a gate voltage applied to the second transistor, current bypassed to ground through the second transistor is greater than current bypassed to ground through the first transistor.

16. The flash memory device circuit of claim 10, wherein the selected bit line is associated with a selected memory cell in an OFF state, and a voltage level of the drain of the second transistor becomes higher than a voltage level of the drain of the first transistor during a sensing operation associated with the selected memory cell.

17. The flash memory device of claim 10, wherein the selected bit line is associated with a selected memory cell in an ON state, and a voltage level of the drain of the first transistor becomes higher than a voltage level of the drain of the second transistor during a sensing operation associated with the selected memory cell.

18. A method of sensing data in a selected nonvolatile memory cell using a current mirror type sense amplifier circuit providing a differential output within a flash memory device, the method comprising:
supplying a reference voltage to the sense amplifier circuit via an unselected bit line; and
using different current driving capabilities for first and second transistors within the sense amplifier to sense the data in relation to the reference voltage, and outputting the differential output using the first and second transistors as respective output nodes.

19. The method of claim 18, wherein if the selected memory cell is in an OFF state, a voltage level of a drain of the second transistor becomes higher than a voltage level of a drain of the first transistor during a sensing operation associated with the selected memory cell.

20. The method of claim 18, wherein if the selected memory cell is in an ON state, a voltage level of the drain of the first transistor becomes higher than a voltage level of the drain of the second transistor during a sensing operation associated with the selected memory cell.

* * * * *